United States Patent [19]
Lee

[11] Patent Number: 5,949,697
[45] Date of Patent: Sep. 7, 1999

[54] SEMICONDUCTOR MEMORY DEVICE HAVING HIERARCHICAL INPUT/OUTPUT LINE STRUCTURE AND METHOD FOR ARRANGING THE SAME

[75] Inventor: Kyu-chan Lee, Seoul, Rep. of Korea

[73] Assignee: Samsung Electronics, Co., Ltd., Suwon, Rep. of Korea

[21] Appl. No.: 08/988,289

[22] Filed: Dec. 10, 1997

[30] Foreign Application Priority Data

Dec. 10, 1996 [KR] Rep. of Korea ............... 96-64008

[51] Int. Cl.$^6$ .................................................. G11C 5/02
[52] U.S. Cl. ................... 365/51; 365/63; 365/230.06
[58] Field of Search ..................... 365/51, 63, 72, 365/205, 230.06

[56] References Cited

U.S. PATENT DOCUMENTS

| | | | |
|---|---|---|---|
| 5,485,426 | 1/1996 | Lee et al. | 365/203 |
| 5,535,172 | 7/1996 | Reddy et al. | 365/230.03 |
| 5,650,975 | 7/1997 | Hamade et al. | 365/230.01 |
| 5,708,620 | 1/1998 | Jeong | 365/230.06 |
| 5,781,495 | 7/1998 | Arimoto | 365/230.03 |
| 5,808,955 | 9/1998 | Hwang et al. | 365/230.06 |
| 5,831,919 | 11/1998 | Haukness et al. | 365/205 |
| 5,862,098 | 1/1999 | Jeong | 365/230.06 |
| 5,875,149 | 2/1999 | Oh et al. | 365/230.06 |

OTHER PUBLICATIONS

"A 2.5ns Clock Access 250MHz 256Mb SDRAM with a Synchronous Mirror Delay," Takanori Saeki, et al., 1996 IEEE International Solid–State Circuits Conference Digest of Technical Papers, pp. 374–375.

*Primary Examiner*—David Nelms
*Assistant Examiner*—Hien Nguyen
*Attorney, Agent, or Firm*—Marger Johnson & McCollom, PC

[57] ABSTRACT

A semiconductor memory device having a hierarchical input/output line structure and a method for arranging the same are provided. The semiconductor memory device includes a sub-array including a plurality of memory cells. The semiconductor memory device further includes a sense amplifier for sensing and amplifying the data of the memory cells of the sub-array. The semiconductor memory device further includes a sub-word line driver for driving the word lines of the memory cells. The semiconductor memory device further includes a local input/output line for receiving and transmitting the output signal of the sense amplifier. The semiconductor memory device further includes a global input/output line for receiving and transmitting the signal of the local input/output line. The semiconductor memory device further includes switching means for transmitting the signal of the local input/output line to the global input/output line in response to predetermined control signals. A conjunction area is formed in an intersecting area between the sense amplifier and the sub-word line driver. In particular, the switching means are separated and arranged in the conjunction areas in which the local input/output line intersects the global input/output line. A P driver and an N driver for driving the sense amplifier are arranged in the same conjunction.

9 Claims, 3 Drawing Sheets

SEMICONDUCTOR MEMORY DEVICE HAVING HIERARCHICAL INPUT/OUTPUT LINE STRUCTURE AND METHOD FOR ARRANGING THE SAME

BACKGROUND OF THE INVENTION

1. Field of the Invention

The present invention relates to a semiconductor memory device, and more particularly, to a semiconductor memory device having a hierarchical input/output line structure and a method for arranging the same.

2. Description of the Related Art

As the integration degree of a semiconductor memory device increases and the design rule thereof device decreases, a sense amplifier area and a sub-word driver area become smaller and the number of circuits related to the sensing of the sense amplifier area increases. Accordingly, a load sharply increases. Therefore, a structure in which drivers for driving the sense amplifier are dispersed in the respective conjunction areas is employed in order to rapidly drive a heavy load. Also, as the input/output of more data are required in order to satisfy a high data rate in a highly integrated semiconductor memory device, a hierarchical input/output line (which is referred to as a hierarchical IO line) structure, namely, a structure having a local input/output line and a global input/output line is employed in architecture. A switching circuit and circuits related to sensing for forming the hierarchical IO structure should be arranged in the conjunction area between sub-arrays constituted by memory cells in order to make an inner structure of the above memory device.

FIG. 1 shows a conventional core structure in a memory device having the hierarchical IO structure.

Referring to FIG. 1, the conventional core structure of the memory device includes sub-arrays 1a, 1b, 1c and 1d including a plurality of memory cells, sense amplifiers (SA) 2a, 2b, 2c, and 2d for sensing and amplifying the data of the memory cells of the sub-arrays 1a, 1b, 1c, and 1d, sub-word line drivers (SWD) 3a, 3b, 3c, 3d, and 3e for driving the word lines of the memory cells, local input/output lines LIO1 and LIO2 for receiving and transmitting the output signals of the sense amplifiers (SA) 2a, 2b, 2c, and 2d, global input/output lines GIO for receiving and transmitting the signals of the local input/output lines LIO1 and LIO2, and switching portions 4a, 4b, 4c, 4d, 4e, 4f, 4g, and 4h for transmitting the signals of the local input/output lines LIO1 and LIO2 to the global input/output lines GIO in response to predetermined control signals. Conjunction areas 5a, 5b, 5c, and 5d are formed in each intersection area between the sense amplifiers (SA) 2a, 2b, 2c, and 2d and the sub-word line drivers (SWD) 3a, 3b, 3c, 3d, and 3e in the conventional core structure. Also, in the conventional core structure, a P driver PD1 and N drivers ND1 and ND2 for driving the sense amplifiers 2a, 2b, 2c, and 2d are separated and are respectively included in the conjunction 5c and the conjunctions 5b and 5d and a circuit for the hierarchical IO structure is included in the conjunction 5a. Reference numeral LAPG denotes the control signal of the P driver PD1. Reference numeral LANG denotes the control signal of the N drivers ND1 and ND2. Reference numerals PTG and LTG denote separate gate control signals. Reference numeral BL denotes a bit line. Reference numeral BLB denotes a complementary bit line.

In the conventional core structure, the number of the global input/output lines GIO may be restricted, only a specific sub-word driver SWD area may become larger, and a skew difference of about four sub-array blocks is generated between the respective data from the bit line BL which is nearest to the global input/output lines GIO and the bit line BL which is farthest from the global input/output lines GIO since all the global input/output lines GIO are gathered to the sub-word driver (SWD) 3a. Also, since the P driver PD1 and the N drivers ND1 and ND2 for driving the sense amplifiers 2a, 2b, 2c, and 2d are separated in the conventional core structure, delay skew between the operation of a N-type SA and the operation of a P-type SA basically exists, thus worsening a sensing margin in the operation for sensing a low voltage. Also, even though not shown in FIG. 1, since the additional control signals of the switching transistors 4a, to 4h for forming the hierarchical IO structure are necessary, a layout margin is worsened.

SUMMARY OF THE INVENTION

It is an object of the present invention to provide a semiconductor memory device having a hierarchical IO structure in which a global input/output line can be formed in a sub-word driver area which is smaller than in a conventional technology, skew between the data from the bit line which is near the global input/output line and the data from the bit line which is far therefrom is reduced, and delay skew between the operation of an N-type SA and that of a P-type SA is reduced.

It is another object of the present invention to provide a method for arranging a semiconductor memory device having the above hierarchical IO structure.

To achieve the first object, the semiconductor memory device according to the present invention comprises a sub-array including a plurality of memory cells. The semiconductor memory device further comprises a sense amplifier for sensing and amplifying the data of the memory cells of the sub-array. The semiconductor memory device further comprises a sub-word line driver for driving the word lines of the memory cells. The semiconductor memory device further comprises a local input/output line for receiving and transmitting the output signal of the sense amplifier. The semiconductor memory device further comprises a global input/output line for receiving and transmitting the signal of the local input/output line. The semiconductor memory device further comprises switching means for transmitting the signal of the local input/output line to the global input/output line in response to predetermined control signals. A conjunction area is formed in an intersecting area between the sense amplifier and the sub-word line driver. In particular, the switching means are separated and arranged in the conjunction areas in which the local input/output line intersects the global input/output line. Also, a P driver and an N driver for driving the sense amplifier are arranged in the same conjunction.

The switching means comprise transmission gates. The control signals are same as control signals for controlling the P driver and the N driver.

To achieve the second object of the present invention, in a method for arranging a semiconductor memory device, comprising the sub-array, the sense amplifier, the sub-word line driver, the local input/output line, the global input/output line, and the switching means, the conjunction area is formed in the intersecting area between the sense amplifier and the sub-word line driver and the switching means are separated and arranged in the conjunction areas in which the local input/output line intersects the global input/output line. The P driver and the N driver for driving the sense amplifier are arranged in the same conjunction in the above mentioned method for arranging a semiconductor memory device.

BRIEF DESCRIPTION OF THE DRAWING(S)

The above objects and advantages of the present invention will become more apparent by describing in detail a preferred embodiment thereof with reference to the attached drawings in which.

DESCRIPTION OF THE PREFERRED EMBODIMENT(S)

Hereinafter, a preferable embodiment of the present invention will be explained in detail referring to the attached drawings.

Figure 1:
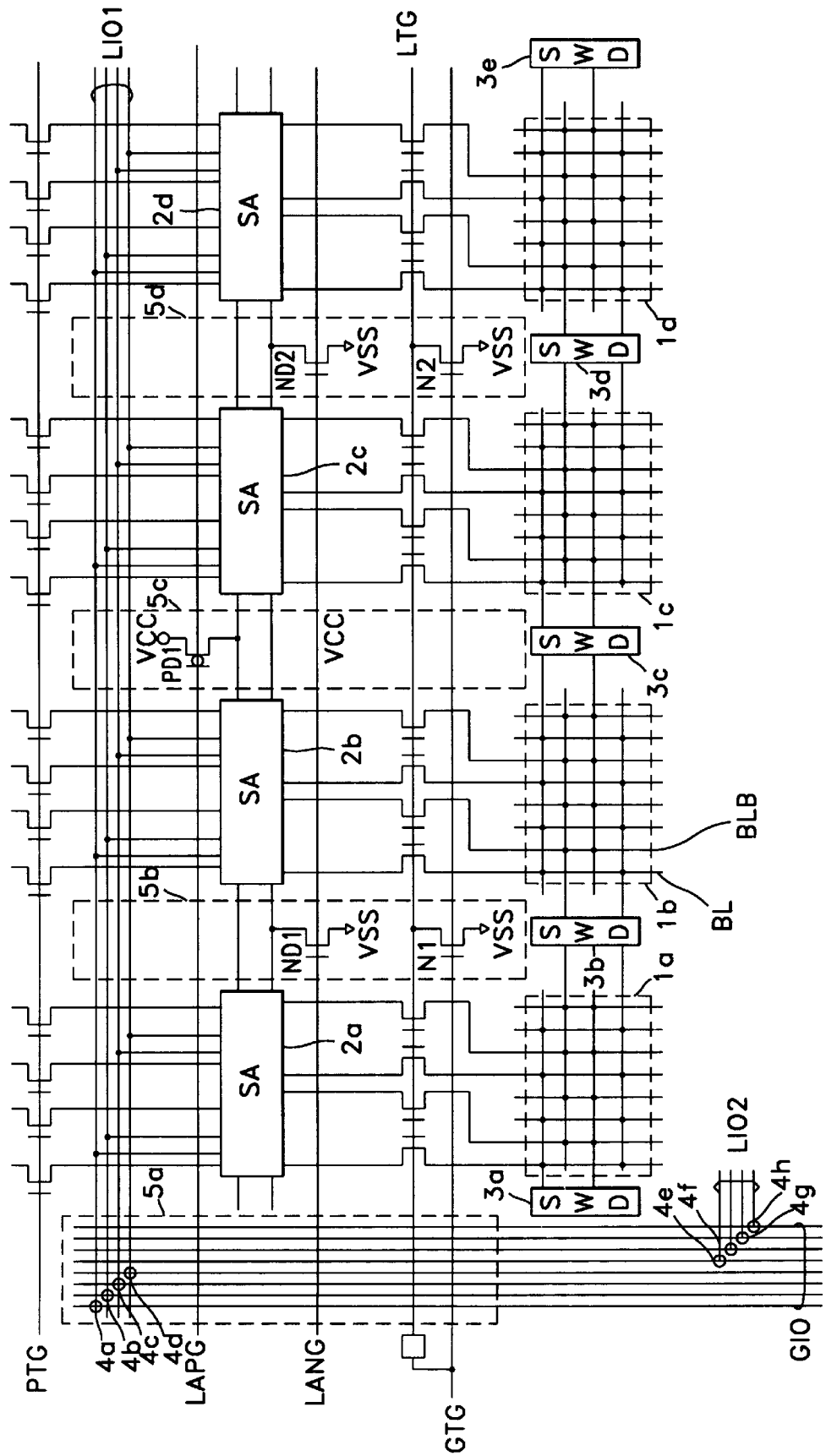
FIG. 1 shows the structure of a conventional core in a memory device having a hierarchical input/output line structure.
Figure 2:
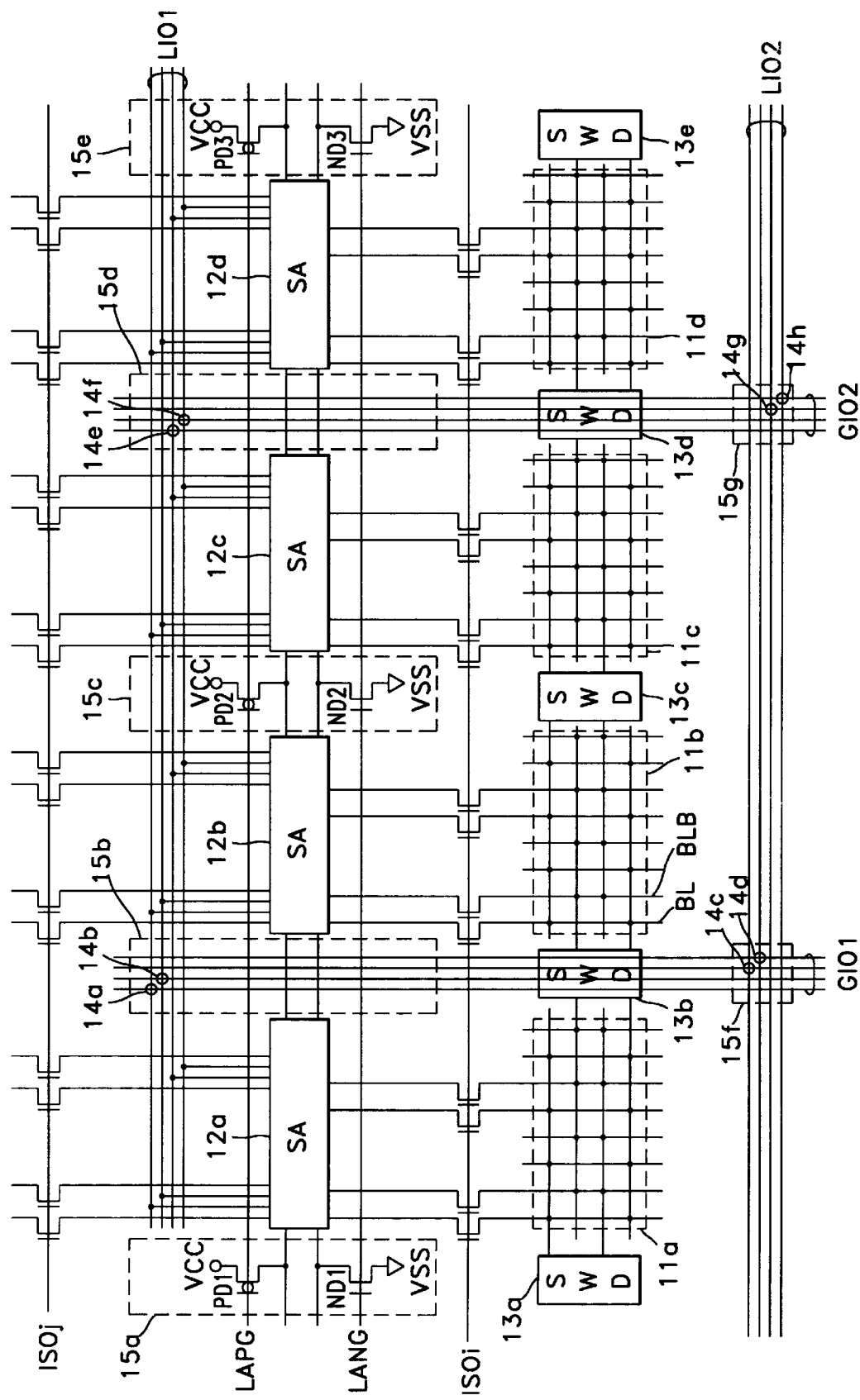
FIG. 2 shows the structure of a core according to the present invention in a memory device having a hierarchical input/output structure.
Figure 3:
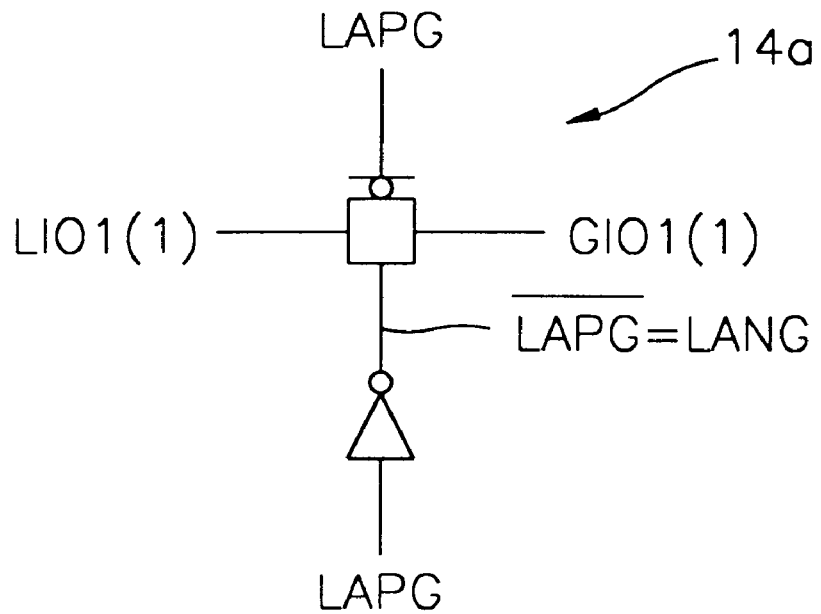
FIG. 3 shows the detail of connections of switches 14A and 14B.
Figure 3:
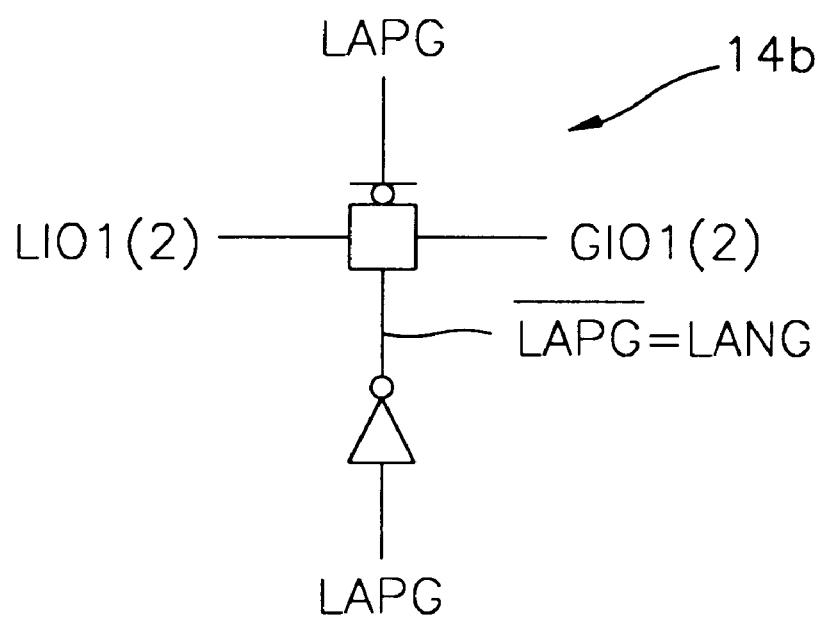

Referring to FIG. 2, the structure of a core according to the present invention includes sub-arrays 11a, 11b, 11c, and 11d including a plurality of memory cells, sense amplifiers (SA) 12a, 12b, 12c, and 12d for sensing and amplifying the data of the memory cells of the sub-arrays 11a, 11b, 11c, and 11d, sub-word line drivers (SWD) 13a, 13b, 13c, 13d, and 13e for driving the word lines of the memory cells, local input/output lines LIO1 and LIO2 for receiving and transmitting the output signals of the sense amplifiers 12a, 12b, 12c, and 12d, global input/output lines GIO1 and GIO2 for receiving and transmitting the signals of the local input/output lines LIO1 and LIO2, and switches 14a, 14b, 14c, 14d, 14e, 14f, 14g, and 14h for transmitting the signals of the local input/output lines LIO1 and LIO2 to the global input/output lines GIO1 and GIO2 in response to predetermined control signals. It is same as in the conventional core structure shown in FIG. 1 that conjunction areas 15a, 15b, 15c, 15d, 15e, 15f, and 15g are formed in the intersecting area between the sense amplifiers 12a, 12b, 12c, and 12d and the sub-word line drivers 13a, 13b, 13c, 13d, and 13e in the core structure according to the present invention. It is different from the conventional core structure shown in FIG. 1 that the conjunctions 15a, 15c, and 15e in which the P drivers PD1, PD2, and PD3 and the N drivers ND1, ND2, and ND3 are arranged and the conjunctions 15b, 15d, 15f, and 15g in which the switches 14a, 14b, 14c, 14d, 14e, 14f, 14g, and 14h are arranged are separated in order to effectively arrange the drivers for driving the sense amplifiers SA 12a, 12b, 12c, and 12d and the switches in the core structure according to the present invention. Accordingly, while the P driver and the N driver are separated from each other and are arranged in the different conjunctions in the conventional core structure shown in FIG. 1, the P driver and the N driver are arranged in the same conjunctions 15a, 15c, and 15e in the core structure according to the present invention. Also, the switches 14a, 14b, 14c, 14d, 14e, 14f, 14g, and 14h are separated and arranged in the different conjunction areas 15b, 15d, 15f, and 15g in which the local input/output lines LIO1 and LIO2 intersect the global input/output lines GIO1 and GIO2. Also, even though not shown, the switches 14a, 14b, 14c, 14d, 14e, 14f, 14g, and 14h are constituted by transmission gates and the control signals for controlling the switches are same as control signals LAPG and LANG for controlling the P drivers PD1, PD2, and PD3 and the N drivers ND1, ND2, and ND3. Reference numerals ISOi and ISOj denote separate gate control signals. Reference numeral BL denotes a bit line. Reference numeral BLB denotes a complementary bit line.

Therefore, two pairs of global input/output lines GIO1 pass through the conjunctions 15b and 15f and other two pairs of global input/output lines GIO2 pass through the conjunctions 15d and 15g since the conjunctions 15a, 15c, and 15e in which the drivers are arranged are separated from the conjunctions 15b, 15d, 15f and 15g in which the switches are arranged in the semiconductor memory device having the core structure according to the present invention. Accordingly, the global input/output line can be also formed in a sub-driver area which is smaller than in the conventional art and the skew between the data from the bit line which is near the global input/output line and the data from the bit line which is far therefrom is reduced.

In addition, since a P driver and an N driver for driving a sense amplifier are arranged within a single conjunction area, the delay skew between the operation of the P-type sense amplifier and that of the N-type sense amplifier is sharply reduced in the respective sense amplifiers, thus improving the sensing margin in the operation for sensing the low voltage. Also, since the same signals used as the control signals for controlling the P driver and the N driver are also used as the control signals for controlling the switches, the layout margin is improved.

The present invention is not restricted to the above embodiments, and it is clearly understood that many variations are possible within the scope and spirit of the present invention by anyone skilled in the art.

What is claimed is:

1. A semiconductor memory device, comprising:
   a sub-array including a plurality of memory cells;
   a sense amplifier for sensing and amplifying the data of the memory cells of the sub-array;
   a sub-word line driver for driving the word lines of the memory cells;
   a local input/output line for receiving and transmitting the output signal of the sense amplifier;
   a global input/output line for receiving and transmitting the signal of the local input/output line; and
   switching means for transmitting the signal of the local input/output line to the global input/output line in response to predetermined control signals,
   wherein a conjunction area is formed in an intersecting area between the sense amplifier and the sub-word line driver, the switching means are separated and arranged in the conjunction areas in which the local input/output line intersects the global input/output line, and a P driver and an N driver for driving the sense amplifier are arranged in the same conjunction.

2. The semiconductor memory device of claim 1, wherein the switching means comprise transmission gates.

3. The semiconductor memory device of claim 1, wherein the control signals are same as control signals for controlling the P driver and the N driver.

4. A method for arranging a semiconductor memory device, comprising a sub-array including a plurality of memory cells, a sense amplifier for sensing and amplifying the data of the memory cells of the sub-array, a sub-word line driver for driving the word lines of the memory cells, a local input/output line for receiving and transmitting the output signal of the sense amplifier, a global input/output line for receiving and transmitting the signal of the local input/output line, and switching means for transmitting the signal of the local input/output line to the global input/output line in response to predetermined control signals, wherein a conjunction area is formed in an intersecting area between the sense amplifier and the sub-word line driver and, wherein the switching means are separated and arranged in the conjunction areas in which the local input/output line intersects the global input/output line and a P driver and an N driver for driving the sense amplifier are arranged in the same conjunction.

5. The method of claim 4, wherein the control signals are same as control signals for controlling the P driver and the N driver.

6. A semiconductor memory device formed on a semiconductor substrate and comprising:

a plurality of sub-arrays of memory cells, each sub-array including a bit line pair of conductors controllably coupled to corresponding memory cells in the sub-array;

a plurality of sense amplifiers, each sense amplifier forming a data bit signal responsive to a corresponding one of the bit-line pairs;

a local input/output line connected to two or more of the sense amplifiers to receive the corresponding data bit signals;

a global input/output line connected to two or more of the local input/output lines to receive the data bit signals received on the local I/O lines;

switching means for controllably connecting the local input/output line to the global I/O line to route the data bit signals during a read operation; and wherein the semiconductor substrate includes means defining a conjunction area in between first and second ones of the sense amplifiers, and the switching means are located within the conjunction area.

7. A semiconductor memory according to claim 6 wherein the global input/output line is routed generally along a predetermined path that overlies the said conjunction area.

8. A semiconductor memory according to claim 6 wherein the global input/output line extends over the said conjunction area and in between an adjacent pair of the sub-arrays of memory cells so as to minimize timing skew.

9. A semiconductor memory according to claim 6 further comprising an N-type driver transistor and a P-type driver transistor for driving one or more of the sense amplifiers, and where both the N-type driver and the P-type driver are located within a single conjunction area of the device.

* * * * *